United States Patent
Camarota

(10) Patent No.: US 7,486,106 B1
(45) Date of Patent: Feb. 3, 2009

(54) CPLD FOR MULTI-WIRE KEYBOARD DECODE WITH TIMED POWER CONTROL CIRCUIT

(75) Inventor: Rafael Czernek Camarota, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/635,246

(22) Filed: Dec. 5, 2006

Related U.S. Application Data

(63) Continuation of application No. 11/582,928, filed on Oct. 17, 2006, now abandoned.

(60) Provisional application No. 60/785,680, filed on Mar. 24, 2006.

(51) Int. Cl.
*H03K 17/16* (2006.01)
*H03K 19/003* (2006.01)

(52) U.S. Cl. ............... 326/33; 326/112; 326/119
(58) Field of Classification Search ............... 326/33, 326/112, 119, 121
See application file for complete search history.

(56) References Cited

U.S. PATENT DOCUMENTS

| | | | | |
|---|---|---|---|---|
| 7,129,745 B2 * | 10/2006 | Lewis et al. | ................... | 326/38 |
| 7,222,244 B2 * | 5/2007 | Kawahara et al. | ........... | 713/300 |
| 7,245,148 B2 * | 7/2007 | Awalt et al. | ................... | 326/38 |

* cited by examiner

*Primary Examiner*—Anh Q Tran
(74) *Attorney, Agent, or Firm*—Martine Penilla & Gencarella, LLP

(57) ABSTRACT

The present invention is directed to a circuit and a method that features selectively isolating a logic device from a source of power implementing a counter circuit to transmit a signal to a voltage control device to isolate a source of power from a logic device, coupled to a plurality of switching elements, with the voltage control device being coupled to allocate power to the logic device in response to activation of one of said plurality of switching elements. The logic device is typically a programmable logic device. In one embodiment, the voltage control device is a field effect transistor. In another embodiment the voltage control device is a voltage regulator.

21 Claims, 6 Drawing Sheets

CPLD FOR MULTI-WIRE KEYBOARD DECODE WITH TIMED POWER CONTROL CIRCUIT

CROSS REFERENCE TO RELATED APPLICATIONS

This application is a continuation of U.S. patent application Ser. No. 11/582,928 filed Oct. 17, 2006, now abandoned, entitled "CPLD FOR MULTI-WIRE KEYBOARD DECODE WITH TIMED POWER CONTROL CIRCUIT", which claims priority to U.S. provisional patent application No. 60/785,680 filed Mar. 24, 2006, entitled "USING CPLD FOR TWO-WIRE KEYBOARD DECODE WITH POWER-UP DETECT CIRCUIT", and listing Rafael Camarota as inventor, which is incorporated by reference in its entirely herein.

This application claims priority to U.S. Provisional Application No. 60/785,680 filed on Mar. 24, 2006, entitled "USING CPLD FOR TWO-WIRE KEYBOARD DECODE WITH POWER-UP DETECT CIRCUIT", and listing Rafael Camarota as inventor, which is incorporated by reference in its entirely herein.

BACKGROUND

Portable electronic devices have become dominant in various segments of the economy outside of the consumer segment. For example, over the last two decades portable electronic devices have come to include not only calculators, general processing computer systems, cellular telephones, and personal digital assistants, but also portable electronic devices in the commercial segment, such as, bar code scanners, point of sale terminal, electronic toll reader and the like. The introduction of wireless standards, such as BLUETOOTH® wireless Fidelity and the 802.11e standard has increased the portability of devices by facilitating the independence of the same from traditional wiring and power infrastructures. In short, a large percentage of portable electronic devices are now battery powered with the percentage seen as increasing in the foreseeable future. To increase the operational efficiency of these portable devices, power management has become increasingly important.

Power management is traditionally exercised by terminating power to a device or reducing the power consumed by a device through terminating power to various sub-systems of the same. An early example of power management is the Advanced Power Management (APM) standard that reduces power consumed by a computer system through terminating operation of a subset of the subsystems and reducing operational performance of other subsystems. APM allows a basic integrated operating system (BIOS) of a general purpose computing system to regulate power management. This may be achieved by reducing the operational speed of the CPU speed, terminating operation of hard disk drives, terminating power to a monitor. The power reduction may be implemented after a preset period of inactivity.

The APM standard was replaced by Advanced Configuration and Power Interface (ACPI) which permits the operating system of a general purpose computing system to regulate power management. The (ACPI) supports keys on a normal keyboard for suspending or powering off the computer and has been extended to support Power management keys, e.g., keys on a keyboard dedicated to implementing specific power management functions such as gating power, placing the computer system in a low power (sleep) mode and returning the computer system to operational mode from the sleep mode (wake).

A need exists, therefore, to provide improved techniques for power management of portable devices.

SUMMARY

It should be appreciated that the present invention can be implemented in numerous ways, including as a process, an apparatus, a system, a device, or a method. Several inventive embodiments of the present invention are described below.

Broadly speaking, the present invention is direct to a circuit and a method that features a counter circuit to transmit a signal to a voltage control device to isolate a source of power from a logic device, coupled to a plurality of switching elements, with the voltage control device being coupled to allocate power to the logic device in response to activation of one of said plurality of switching elements. The logic device is typically a programmable logic device. In one embodiment of the present invention, the voltage control device is a field effect transistor. In another embodiment the voltage control device is a voltage regulator. An exemplary embodiment of the present invention embodiment discusses the voltage control device used in conjunction with a decode apparatus to facilitate identifying the switching element, among the plurality of switching elements, associated with the activation. To that end, one terminal of each switching element is coupled to the decode apparatus with the remaining terminal being coupled in series to a terminal of an adjacent switching element through a resistor. The decode apparatus may be a standard analog to digital decoder or logic that measures the RC delay associated with the switching elements. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
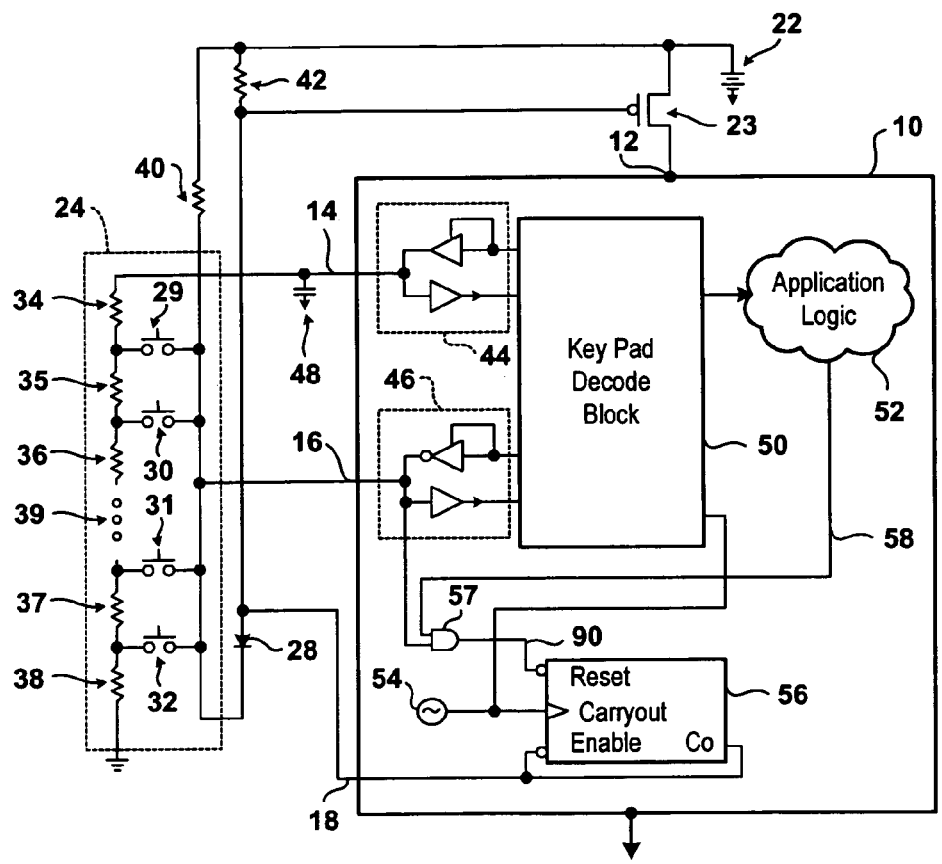
FIG. 1 is a simplified schematic diagram showing a logic device coupled to a switching network and power supply incorporating the present invention in accordance with one embodiment.

Referring to FIG. 1 shown is a logic device 10 having a plurality of inputs and outputs (I/Os) shown as 12, 14, 16 and 18. Power input 12 is coupled to a power supply 22 through a voltage control device 23, shown as a p-channel field effect transistor pFET. Specifically, power input 12 is coupled to a source/drain region of switching circuit 22 with power supply 22 coupled to the remaining source/drain region of voltage control device 23. I/Os 14 and 16 are coupled to a switching network 24, and I/O 18 is coupled in common to the gate of voltage control device 23 and an anode of a diode 28. Switching network 24 includes a plurality of switching elements 29-32. Any switching element may be implemented; however, in the present example each of switching elements 29-32 is a single pole single throw (SPST) switching element. Also included in switching network 24 is a resistor stack consisting of a plurality of resistors 34-38 are coupled in series between I/O 14 and ground. A cathode of diode 28 is connected in common with one terminal of each of switching elements 29-32, with the remaining terminal of each switching element being connected to a unique pair of series resistors of resistors 34-38. A pull up resistor 40 is connected in series between the cathode of diode 28 and power supply 22. The gate of voltage control device 23 is connected to power supply 22 through pull-up resistor 42. Although four switching elements 29-32 are shown coupled to the resistor stack, any number may be present, as indicated by ellipsis 39. Specifically, resistor 35 is coupled in series between terminals of switching elements 29 and 30, resistor 37 is coupled in series between terminals of switching elements 31 and 32, and resistor 36 is coupled between terminals of switching element 30 and the switching element that would be associated with ellipsis 39. Resistor 34 is coupled in series between I/O 14 and a terminal of switching element 29, and resistor 38 is coupled in series between ground and a terminal of switching element 32.

In the present example, power supply 22 is shown as a direct current source and may include any type of battery, e.g., nickel-cadmium, alkaline and the like. In the present example power supply 22 comprises of alkaline batteries of the size AA. Although logic device 10 may be any known, in the present example, logic device 10 consists of a complex programmable logic device (CPLD) available from Altera Corporation of Santa Clara, Calif. under the mark MAXI. Logic device 10 has been configure to have I/Os 14 and 16 couple to internal circuitry as open source bi-directional Schmitt Trigger inputs (open source BIDI) and open drain bi-directional Schmitt Trigger inputs (open drain BIDI). In this manner, open source BIDI 44 defines a pre-charge node at I/O 14. A capacitor 48 is coupled between I/O 14 and ground. Open drain BIDI 46 defines a sense node at I/O 16. Considering that logic device 10 may be configured as desired, a Key Pad Decode Block 50 is configured to couple between open source BIDI 44 and open drain BIDI 46, as well as other application logic 52 contained in logic device 10 and clock pulse generator 54.

During operation, logic device 10 may be operating under power supply 22 vis-à-vis voltage control device 23. Were no activity sensed by counter circuit 56, from either application logic 52 or switching elements 29-32 for a predetermined interval of time, a signal would be transmitted to I/O 18 to terminate operation of logic device 10. The interval of time may be any desired and is determined by counter 56 receiving a sequence of clock pulses (not shown) from clock pulse generator 54 producing the same at a desired frequency, e.g., 4.4 megahertz. Were no activity measured by counter 56 after a desired number of clock pulses (not shown) had been counted, the signal at I/O 18 is transmitted. To sense activity an output of an AND gate 57 is connected to a reset input of counter circuit 56 and one of the inputs of AND gate 57 is connected to I/O 16, with the remaining input being connected to application logic 52. To terminate operation of logic device 10, a sufficient voltage would be present at I/O 18 to reverse bias voltage control device 23, thereby isolating power supply 22 from logic device 10. The isolation of power supply 22 remains until one of switching elements 29-32 is activated. In this manner, voltage control device 23 functions as a voltage means for controlling power to logic device 10 and both counter circuit 56 and AND gate 57 function as a means for transmitting a signal to voltage control device 23 to terminate power to logic device 10.

Activation of one of switching elements 29-32 pulls the gate of voltage control device 23 close to ground, forward biasing the same, thereby allocating power from power supply 22 to logic device 10. To that end, the voltage divider, created when switching element 32 is activated, between resistor 42, diode 28, switching element 32 and resistors 34-38 provide a voltage to the gate of voltage control device 23 that is an appropriate voltage level to activate the same allocating $V_{CC}$ to logic device 10, i.e., provide a gate-source voltage $V_{GS}$ defined as follows:

$$V_{GS} = -1((V_{CC}-V_F)/V_{CC})((R_{42})/(R_{34}+R_{35}+R_{36}+ \ldots + R_{37}+R_{38})) <\approx -0.7V \tag{1}$$

where $V_F$=in the voltage drop across diode 28 when forward biased and $V_{CC}$ is the supply voltage of power supply 22, which is in a range of 3.0 to 2.2 volts. Forward bias of voltage control device 23 and the presence of diode 28 ensure that subsequent deactivation of one of the switching elements 29-32 while power allocated to logic device I/O 18 is low prevents I/O 16 from having a high voltage signal thereon that would reverse bias voltage control device 23. In this manner, switching network 24 functions as a means for communicating a signal to voltage control device 23 to allocate power to logic device 10. Alternatively, or in conjunction with switching system 24, application logic 52 may function as a means for communicating a signal to voltage control device 23 to allocate power to logic device 10.

Figure 2:
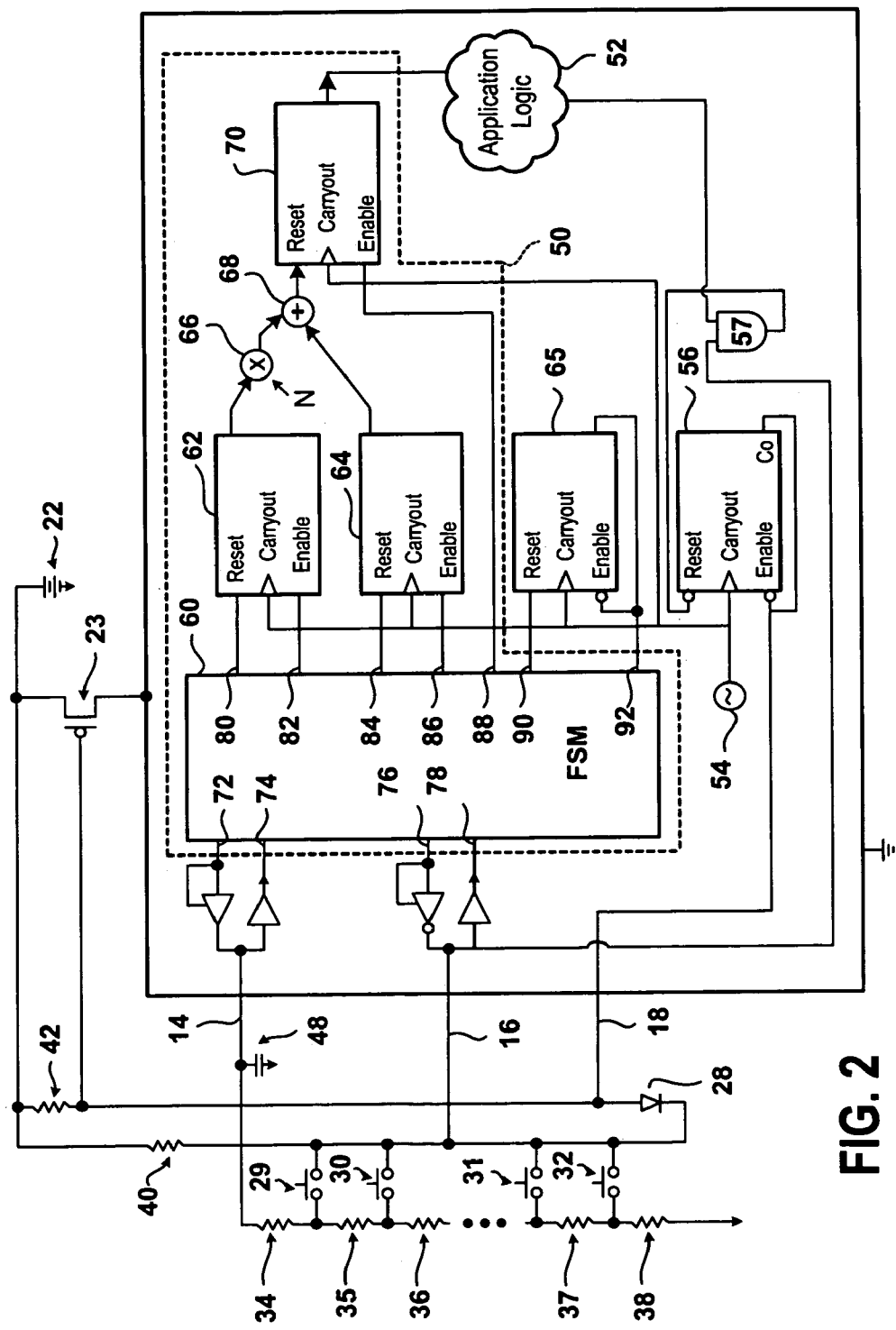
FIG. 2 is a detailed schematic view of the circuit shown in FIG. 1 in accordance with a further embodiment of the present invention.

Referring to both FIGS. 1 and 2, Key Pad Decode Block 50 includes a finite state machine (FSM) 60, a data counter 62, reference counter 64, a debounce counter 65, multiplier 66, divider 68 and switch register 70. FSM 60 includes a Pre-Charge output 72, a preChargeData input 74, a Sense output 76 and a SenseData input 78, as well as a PreCharge SampleEnable output 80, a preChargeData SampleReset output 82, a RefReset output 84, a RefEnable output 86 and a SwitchLoad output 88 and a timer reset output 90 and a timer output 92. The values of 34-38 are such that total the resistance shorted to I/O 16 upon activation of switching element 29 produces a voltage, $V_{Sense}$, at I/O 16 that is lower than an input threshold voltage, $V_{IL}$, of logic device 10 defined as follows:

$$V_{Sense}=(R_{34}+R_{35}+\ldots+R_{36}+R_{37})/(R_{34}+R_{35}+\ldots+R_{36}+R_{37}+R_{40})<V_{IL} \quad (2)$$

where $R_{34}$, $R_{35}$, $R_{36}$, $R_{37}$ and $R_{40}$, are the resistance values of resistors 34, 35, 36, 37 and 39, respectively. It is desired that the resistance value $R_{34}$ be no less than the minimum compatible with the drive of I/O 14. To that end, the resistance value of resistor 34, $R_{34}$, may be defined as follows:

$$(V_{CC}-V_{I/O14})/R_{34}<I_{I/O14} \quad (3)$$

where $V_{I/O14}$ is the drive voltage for I/O 14, $I_{I/O14}$ is the maximum drive current for I/O 14. It is also desired that the resistance value $R_{34}$ be no less than the minimum compatible with the drive of I/O 16. To that end, the resistance value $R_{34}$ should satisfy the following:

$$(V_{CC}-V_{I/O16})/R_{34}<I_{I/O16} \quad (4)$$

where $V_{I/O16}$ is the drive voltage for I/O 16, $I_{I/O16}$ is the maximum drive current for I/O 16.

Resistors 34, 35, 36, 37 and 39 and capacitor 48 define an RC time constant defined, upon Schmitt Trigger 46 placing I/O 16 in a high impedance state as follows:

$$\tau=(R_{34}+R_{35}+\ldots+R_{36}+R_{37})C_{48} \quad (5)$$

where $C_{48}$ is the capacitance of capacitor 48. Assuming Schmitt Trigger 46 has placed I/O 16 at a logical "0", e.g., a low state, activation of any one of switching elements 29-32 produces a change in the RC time constant $\tau$ that may be sensed. For example, were switching element 30 activated, RC time constant $\tau$ becomes faster shown as follows:

$$\tau=(R_{34}+R_{35})C_{48} \quad (6)$$

Were switching element 32 activated, RC time constant $\tau$ is defined as follows:

$$\tau=(R_{34}+R_{35}+\ldots+R_{36}+R_{37})C_{48} \quad (7)$$

To accurately distinguish activation of any one of switching elements 29-32 from the remaining switching elements 29-32 based upon changes in measured RC time constant, $\tau$, a reference RC time constant $\tau_R$ is determined when I/O 14 is at a logical "1", high state and then released, and I/O 16 is in a high impedance state. Following determination of $\tau_R$, a measured RC time constant, introduced by activation of one of switching elements 29-32, $\tau_S$ is obtained when I/O 16 is at a logical "0", e.g., held in a low state, and I/O 14 is at a logical "1" and then released. The difference between $\tau_R$ and $\tau_S$, as well as the aggregate resistance value I/O 14 and ground facilitate associated an RC time constant with each of switching elements 29-32 that differs from the RC time constant associated with the remaining switching elements 29-32, i.e., the switching element pressed is readily decoded.

Figure 3:
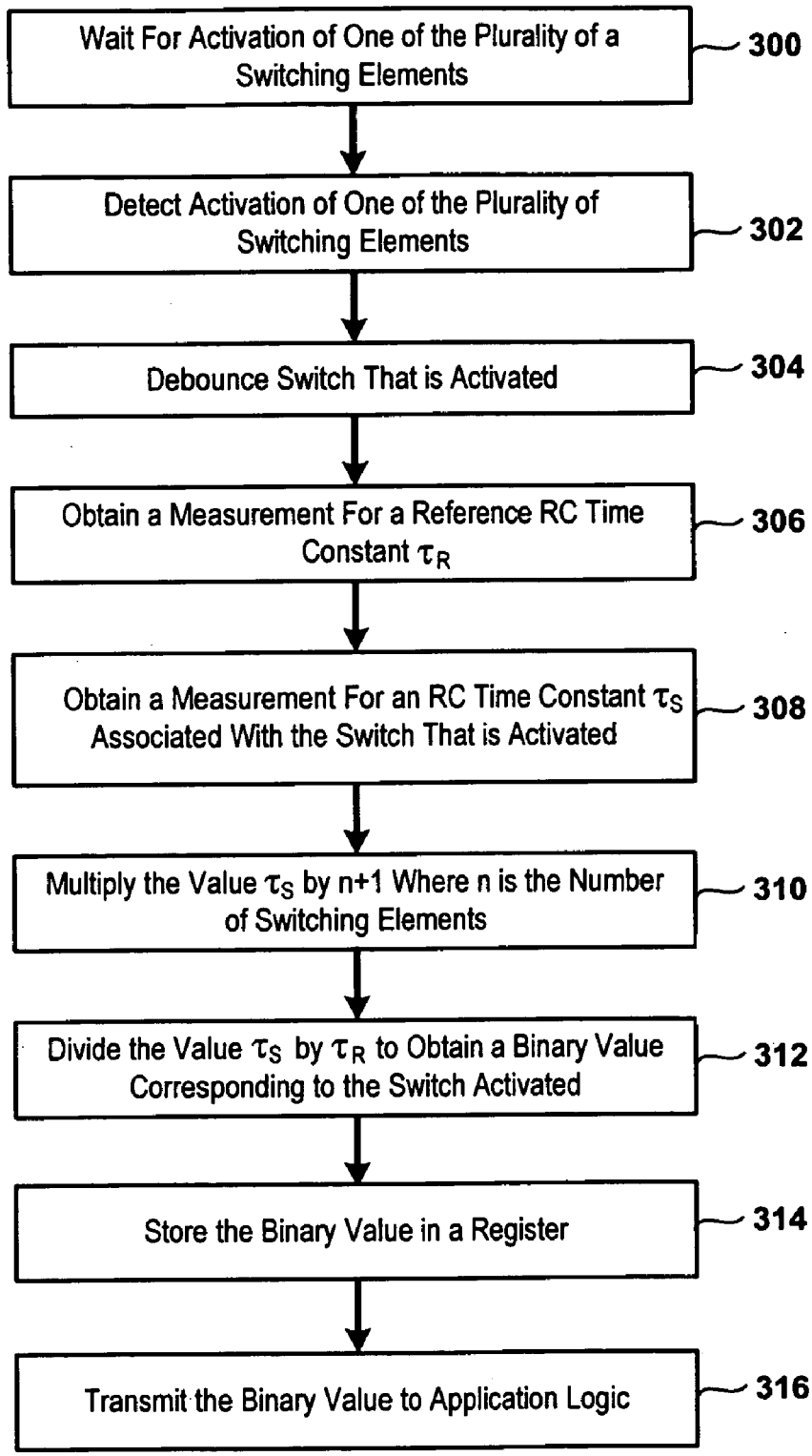
FIG. 3 is a flow diagram showing the operation of the logic device shown in FIG. 2 in accordance with the further embodiment of the present invention.

Referring to both FIGS. 2 and 3, in operation reference counter 64 functions to determine $\tau_R$ and data counter 62 is used to determine $\tau_S$. At function 300 decode block 50 waits for activation of one of switching elements 29-32 by periodically sensing signals produced by activation of switching elements 29-32. In this state, I/O 16 is at a logical "1", e.g., essentially at $V_{CC}$. Typically, FSM 60 senses signals every 100 micro-seconds, with the sampling frequency being controlled by clock generator 54 producing a sequence of clock pulses (not shown) as discussed above. At function 302 activation of one of switching elements 29-32 is detected. Without activation of any switching elements 29-32 FSM 60 isolates both I/Os 14 and 16 from both ground and $V_{CC}$.

Upon activation of one of switching elements 29-32, I/O 16 is placed at a logical "0", e.g., at or near ground potential. At function 304 decode block 50 de-bounces the activation by waiting a predetermined period to ensure the state of I/O 16 maintains the logical "0" state. This is determined by counter 65 and is typically in a range of 100 to 200 microseconds. At function 306, $\tau_R$ is measured to normalize the measured switching element RC time constant $\tau_S$. To that end FSM 60 drives I/O 14 to a voltage level $V_{CC}$ and I/O 16 is isolated from ground and $V_{CC}$. FSM 60 then terminates/releases voltage applied to I/O 14, and I/O 14 is allowed to return to a voltage level that is approximately equal to the Schmitt trigger 44 threshold voltage level $V_{T44}$. The number of clock cycles generated by oscillator 54 until I/O 14 reaches ground is determined by counter 64 and stored therein.

At function 308, measured is the RC time constant $\tau_S$ for one of switching elements 29-32 activated. This is achieved by I/O 16 to ground and driving I/O 14 to $V_{CC}$ and then terminating/releasing the voltage applied to I/O 14 and allowing I/O 14 to return to a voltage level that is approximately equal to the Schmitt Trigger 44 threshold voltage level $V_{T44}$. The number of clock cycles generated by oscillator 54 until I/O 14 reaches ground is determined by counter 62 and the value stored therein. Thereafter, multiplier 66 multiplies the value stored in counter 62 by N at function 310, which is then divided by the value stored in counter 64 by divider 68 at function 312. To that end, one or more finite state machines (not shown) may be employed to perform the desired necessary computations in parallel or in series. For example, a finite state machine (not shown) may be employed to multiply by perform a sequence of addition operations. Another finite state machine (not shown) may be employed to divide by performing a sequence of subtraction operations. Thereafter the binary value may be loaded into register 70 for transmission at function 314 and transmitted as desired to appropriate application logic 52 at function 316.

The quantity N is equal to total resistance of resistors 34-38 divided by resistance value $R_{38}$ where resistors 35-38 are of the same value. The result is a binary value of one of the switching element 29-32 activated. The value of capacitor 48 may be changed to adjust the typical discharge time, with the bits required in the counters 62 and 64 to accurate determine either RC constant $\tau_R$ $\tau_S$ being inversely proportional to the discharge time. The minimum recommended number of bits for each of counters 62 and 64 $\text{Log}_2(4N)$ bits, rounded up.

To improve the accuracy of decoding switching elements 29-32, $R_{34}$ should not be a value that is an even multiple either one of $R_{35}$-$R_{38}$. Were resistor 34 to have a value $R_{34}$ that is an exact even multiple M of the value of either one of values $R_{35}$-$R_{38}$, the values generated at functions 310 and 312 may be only one away from the next lower switching element value. This may mean that the division remainder will always be 1 or 0. Therefore a small amount of noise could make the circuit miss read a switching element if the value stored in counters 64 and 62 deviated by only one bit. By making the value of $R_{34}$ a multiple of M+0.5, the remainder of the value generated at function 312 will typically be 0.5(value of counter 62/N). Therefore, a greater amount of noise could be tolerated before counters 62 and 64 provide values that may result in improperly decoding activation of switching elements 29-32. For example, the values $R_{35}$-$R_{38}$ of each of resistors 35-38 are a substantially identical value of approximately 33 Ohms. The value $R_{34}$ of resistor 34 need not be an exact even multiple of 33 Ohms. Rather, resistor 34 may have a value defined as follows:

$$R_{34}=(M+0.5)33 \text{ Ohms.} \quad (8)$$

Figure 4:
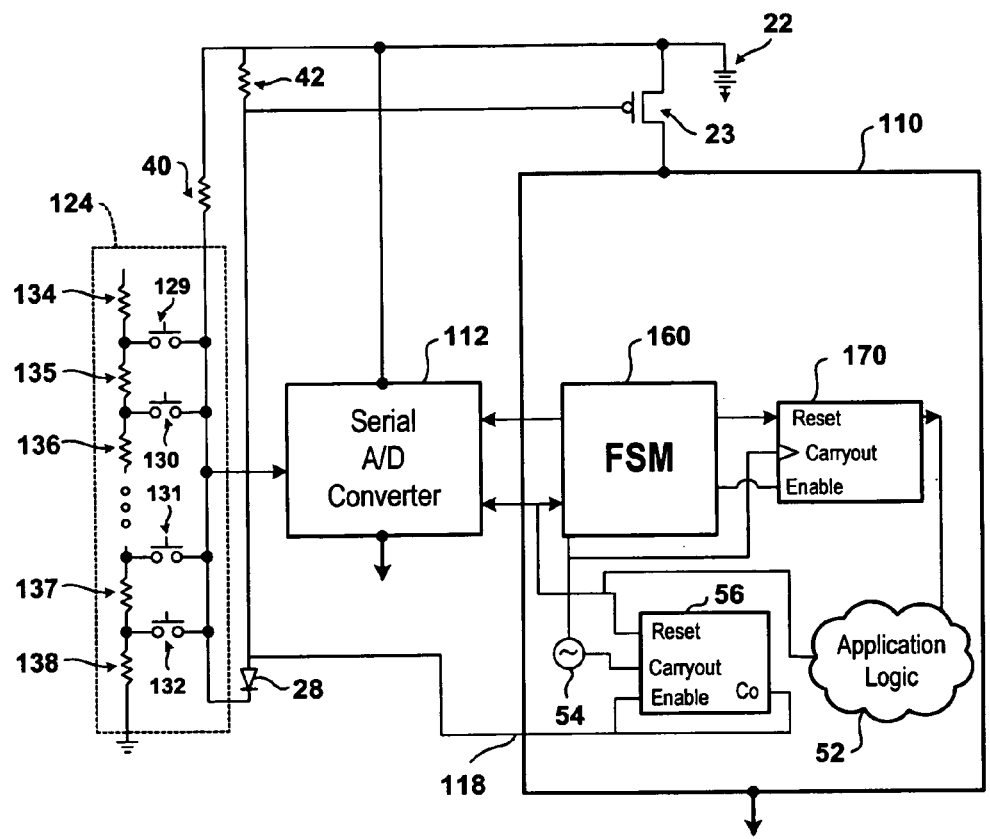
FIG. 4 is a simplified schematic diagram showing a logic device coupled to a switching network through an analog to digital converter used to decode the switching array and incorporating power supply control in accordance with a first alternate embodiment of the present invention.

Referring to FIGS. 1 and 4 it should be understood that voltage control device 23 may be employed with switching element decoding schemes other than those set forth above, such as a serial analog to digital converter 112 coupled between logic device 110 and switching network 124. Logic device 110 is essentially the same as logic device 10 configured to have FSM 160 and register 170 coupled to oscillator 54 and counter 56. Analog to digital converter 112 may be any known in the art. Specifically, FSM 160 is configured to receive signals from converter 112 and converter is connected to receive signals from switching elements 129, 130, 131 and 132. Specifically, switching circuitry 124 is configured substantially the same as switching circuitry 24 with resistors 134-138 corresponding to resistors 34-38, respectively and switching elements 29-32 corresponding to switching elements 129-132, respectively. However, resistor 134 is coupled to $V_{CC}$ unlike resistor 34, which is coupled to I/O 14.

Logic device 110 and converter 112 operates under power from supply 22 vis-à-vis voltage control device 23. Were no activity sensed by counter circuit 56, from either application logic 52 or switching elements 129-132 for a predetermined interval of time, a signal would be transmitted to I/O 118. To sense activity an input of counter 56 is coupled to receive signals from converter 112 or application logic 52. To terminate operation of logic device 110, a sufficient voltage would be present at I/O 18 to reverse bias voltage control device 23, thereby isolating power supply 22 from logic device 110 and converter 112. The isolation of power supply 22 remains until one of switching elements 129-132 is activated. As a result, converter 112 may be considered alternatively to, or in conjunction with, switching network 24 as a means for communicating a signal to voltage control device 23 to allocate power to logic device 10.

Figure 5:
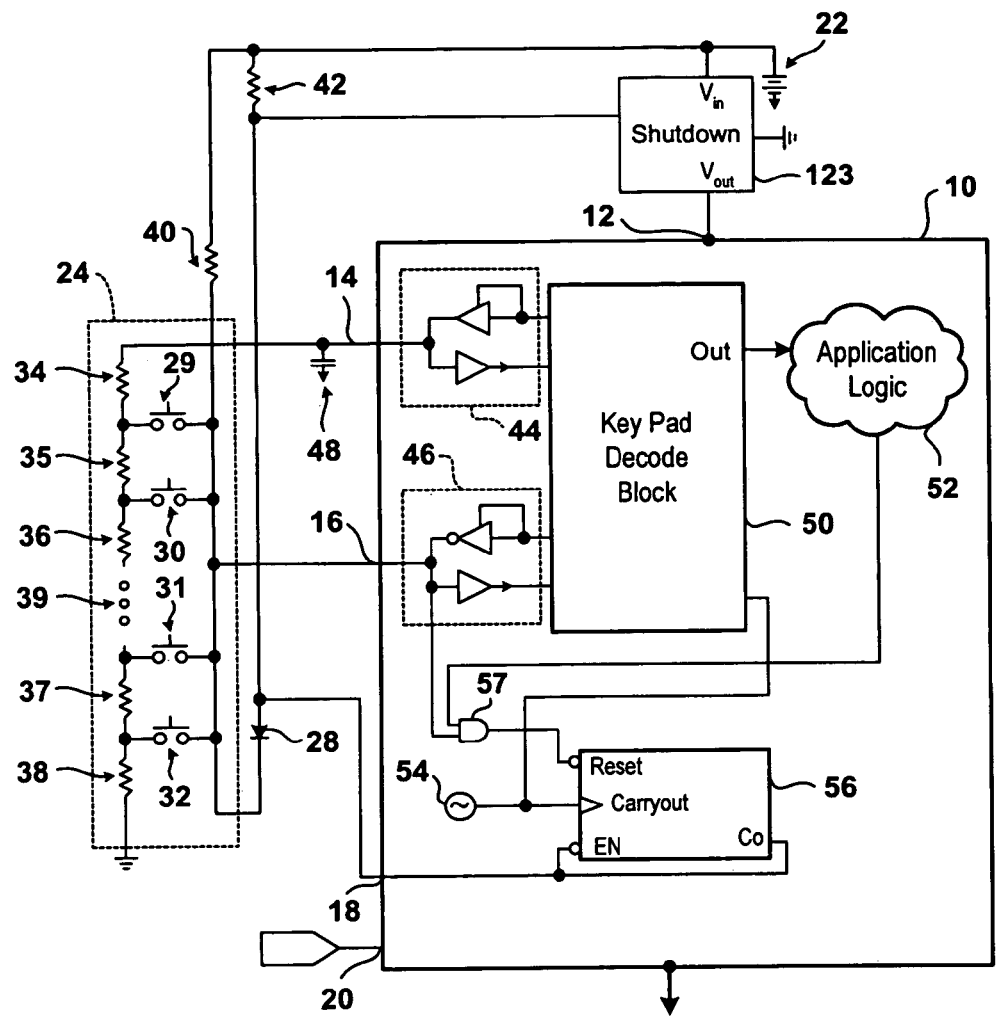
FIG. 5 is a simplified schematic diagram showing a logic device coupled to a switching network and a power supply incorporated the present invention in accordance with a second alternate embodiment.

Activation of one of switching elements 129-132 pulls the gate of voltage control device 23 close to ground, forward biasing the same, thereby allocating power from power supply 22 to logic device 110. To that end, the voltage divider, created when switching element 132 is activated, between resistor 42, diode 28, switching element 132 and resistors 134-138 provide a voltage to the gate of voltage control device 23 that is an appropriate voltage level to activate the same allocating $V_{CC}$ to logic device 110 and A/D converter 112, i.e., provide a gate-source voltage $V_{GS}$ as discussed above. FSM 60 provides the logic necessary to decode the signal from A/D converter 112 and store the same in register 170. In this manner, should application logic 52 require information concerning the identity of one of the switching elements 129-132 activated, register 170 may provide the same. The advantages of the embodiments shown in FIGS. 1, 2 and 5 is that the analog-to digital converter 112 of FIG. 4 is replaced by a simple capacitor 48 and additional logic in logic devices 10 and 110. FSM 160 use to obtain data from analog to digital converter 112 and key pad decoder block 50 are approximately the same complexity.

Figure 6:
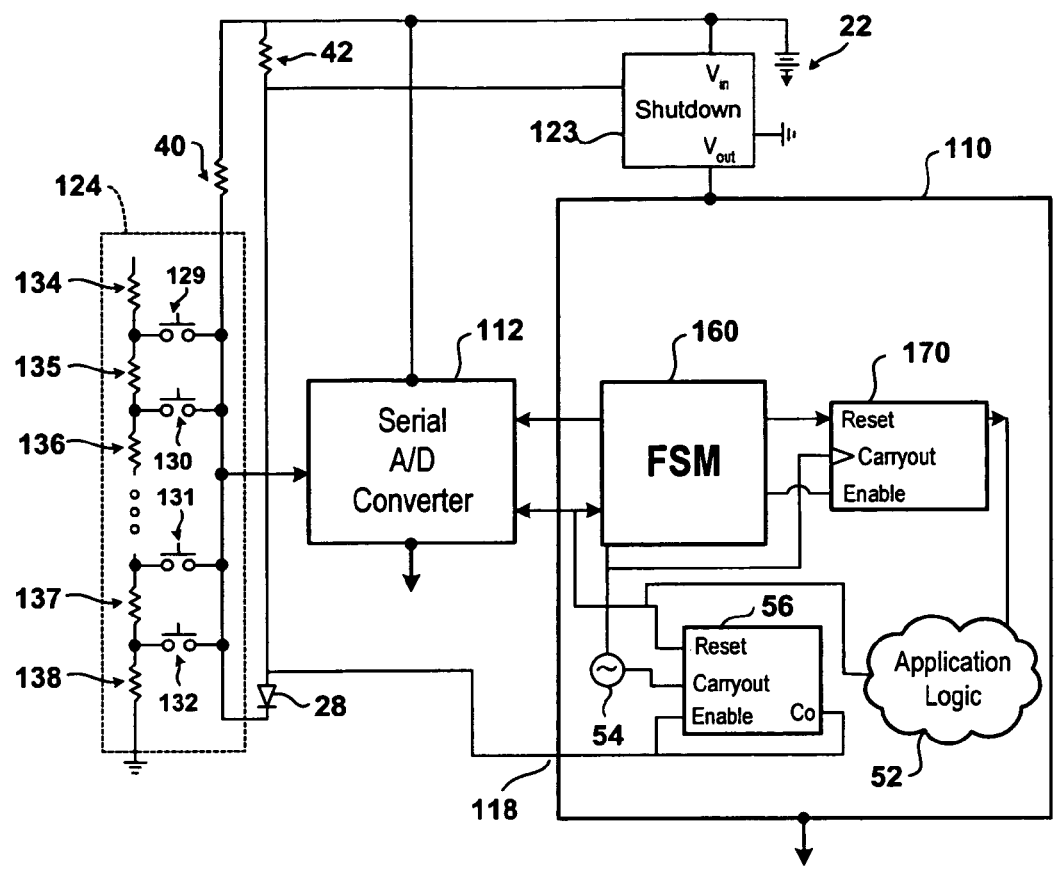
FIG. 6 is a simplified schematic diagram showing a logic device, coupled to a switching network through an analog to digital converter, and a power supply incorporated the present invention in accordance with a third alternate embodiment.

Although the foregoing invention has been described in some detail for purposes of clarity of understanding, it will be apparent that certain changes and modifications may be practiced within the scope of the appended claims. For example, the voltage control circuit 23 shown in either FIGS. 1, 2 and 4 may be replaced with a voltage regulator 123 with and shut down control signal as shown in FIGS. 5 and 6. In this manner, voltage regulator 123 functions as a voltage means for controlling power to logic device 10. Additionally, the keypad decode circuitry discussed above may be employed without the power control circuitry. Accordingly, the present embodiments are to be considered as illustrative and not restrictive, and the invention is not to be limited to the details given herein, but may be modified within the scope and equivalents of the appended claims.

What is claimed is:

1. A circuit coupled to a source of power, an integrated circuit device and a plurality of switching elements, said circuit comprising:
    a voltage control device; and
    a counter circuit coupled to transmit a signal to said voltage control device, said voltage control device being coupled to allocate power to said integrated circuit device in response to activation of one of said plurality of switching elements and coupled to selectively isolate from said source both said counter circuit and said integrated circuit.

2. The circuit as recited in claim 1 wherein said voltage control device allocates power to said counter circuit in response to said activation.

3. The circuit as recited in claim 1 wherein said counter circuit is integrally formed with said integrated circuit device.

4. The circuit as recited in claim 1 wherein said integrated circuit device is a programmable logic device.

5. The circuit as recited in claim 1 wherein said voltage control device is a device selected from a set of devices consisting essentially of a field effect transistor and a voltage regulator.

6. The circuit as recited in claim 1 wherein one each of said plurality of switching elements is coupled to transmit a signal to two ports of said integrated circuit device with said integrated circuit device further including a decode apparatus to identify which one of said plurality of switching elements among said plurality of switching elements is associated with said activation.

7. The circuit as recited in claim 1 further including a switching element decode apparatus for distinguishing one of said plurality of switching elements from the remaining switching elements of said plurality of switching elements based upon an RC delay associated with said one of said plurality switching elements.

8. A circuit coupled to a source of power and an integrated circuit device, said circuit comprising:
    voltage means for controlling power to said integrated circuit device; and
    means for transmitting a signal to said voltage means to terminate said power to said integrated circuit device; and
    means for communicating a signal to said voltage means to allocate said power to said integrated circuit device, said means for communicating, including a plurality of switching elements coupled to transmit an activation signal to said integrated circuit device, said integrated circuit device including a decode apparatus to identify which one of said plurality of switching elements is associated with said activation signal.

9. The circuit as recited in claim 8 wherein said switching elements are coupled to said voltage means.

10. The circuit as recited in claim 8 wherein said means for communicating includes logic elements integrally formed with said integrated circuit device.

11. The circuit as recited in claim 8 wherein said voltage means is a device selected from a set of devices consisting essentially of a field effect transistor and a voltage regulator.

12. The circuit as recited in claim 8 wherein said means for communicating further includes a plurality of switching elements coupled to said voltage means and further including a switching element decode apparatus for distinguishing one of said plurality of switching elements from the remaining switching elements of said plurality of switching elements based upon an RC delay associated with said one of said plurality switching elements.

13. The circuit as recited in claim 8 wherein said integrated circuit device is a programmable logic device.

14. A method for controlling power to an integrated circuit device coupled to a plurality of switching elements, said method comprising:

monitoring said integrated circuit device and said plurality of switching elements to sense signals generated thereby;

isolating said integrated circuit device from said power in response to an absence of said signals for a predetermined interval of time; and allocating said power to said integrated circuit device in response to sensing signals from one of said switching elements device and independent of signals associated with said integrated circuit device.

15. The method as recited in claim 14 wherein isolating further includes generating, with said integrated circuit device, a plurality of clock pulses and measuring said predetermined interval of time based upon a number of said plurality of clock pulses generated by said integrated circuit device.

16. The method as recited in claim 14 further including decoding a signal generated by one of said switching elements to distinguish said one of said switching elements from the remaining switching elements.

17. The method as recited in claim 14 further including sensing an RC delay associated with one of said switching elements to distinguish said one of said switching elements from the remaining switching elements.

18. The method as recited in claim 14 further including sensing an RC delay associated with one of said switching elements to distinguish said one of said switching elements from the remaining switching elements by measuring a reference RC time constant $\tau_R$ and a switching element RC time constant $\tau_M$ and multiplying said switching element RC time constant $\tau_M$ by a desired quantity, obtaining a sum and dividing said sum by said reference RC time constant $\tau_R$.

19. A circuit coupled to a source of power, an integrated circuit device and a plurality of switching elements, said circuit comprising:

a switching element decode apparatus for distinguishing one of said plurality of switching elements from remaining switching elements of said plurality of switching elements based upon an RC delay associated with said one of said plurality switching elements, the switching element decode apparatus including a counter circuit coupled to transmit a signal to a voltage control device to isolate said source of power from said integrated circuit device.

20. The circuit of claim 19 wherein said voltage control device is coupled to allocate power to said integrated circuit device in response to activation of one of said plurality of switching elements, wherein said voltage control device is coupled to selectively isolate from said source, both said counter circuit and said integrated circuit device, in response to said signal.

21. The circuit of claim 19 wherein said integrated circuit is a programmable logic device.

* * * * *